United States Patent [19]

McElroy

[11] Patent Number: 4,896,293
[45] Date of Patent: Jan. 23, 1990

[54] DYNAMIC RAM CELL WITH ISOLATED TRENCH CAPACITORS

[75] Inventor: David J. McElroy, Rosenberg, Tex.

[73] Assignee: Texas Instruments Incorporated, Dallas, Tex.

[21] Appl. No.: 204,337

[22] Filed: Jun. 9, 1988

[51] Int. Cl.$^4$ .................. G11C 11/24; G11C 11/34; H01L 29/78; G03B 27/52

[52] U.S. Cl. .................. 365/149; 365/182; 357/23.6; 357/55; 357/51; 357/49

[58] Field of Search ............... 365/149, 182; 357/23.6, 357/55, 51, 41, 45, 49, 59

[56] References Cited

U.S. PATENT DOCUMENTS

| | | | |
|---|---|---|---|
| 4,571,558 | 7/1988 | Kenney | 357/23.6 |
| 4,574,207 | 3/1986 | Benjamin et al. | 357/55 |
| 4,646,118 | 2/1987 | Takemae | 357/23.6 |
| 4,751,557 | 6/1988 | Sunami et al. | 365/149 |
| 4,752,819 | 6/1988 | Koyama | 365/149 |
| 4,763,180 | 8/1988 | Hwang et al. | 357/23.6 |
| 4,786,954 | 11/1988 | Morie et al. | 357/23.6 |
| 4,792,834 | 12/1988 | Uchida | 365/149 |
| 4,797,719 | 1/1989 | Ueda | 357/23.6 |

FOREIGN PATENT DOCUMENTS 0186875 9/1986 European Pat. Off. .

Primary Examiner—Stuart N. Hecker
Assistant Examiner—Melissa J. Koval
Attorney, Agent, or Firm—Theodore D. Lindgren

[57] ABSTRACT

A dynamic random access memory cell has a storage capacitor and an access transistor formed on only one sidewall of a trench etched into the face of a semiconductor bar. The storage capacitor uses the sidewall of the trench as the storage node, and uses a polysilicon plug as a common node. This polysilicon plug is part of a plate that extends along the face in the trench for a column of like cells, functioning to provide field-plate type of isolation between capacitors along the trench. The channel of the access transistor is formed in the upper part of the one sidewall of the trench, using an upper edge of the capacitor storage node as the source region of the transistor and having a buried N+ drain region on the face at the top. The capacitor areas are isolated from one another on opposite sidewalls, so an array can be laid out that has two cells per bit, to provide improved alpha particle immunity, or by using two wordlines per row a true crosspoint array is possible, providing higher density.

9 Claims, 8 Drawing Sheets 4,896,293

DYNAMIC RAM CELL WITH ISOLATED TRENCH CAPACITORS

RELATED CASES

This application discloses subject matter also disclosed in my copending application Ser. No. (07/198,896), filed May 26, 1988, assigned to Texas Instruments.

BACKGROUND OF THE INVENTION

This invention relates to semiconductor devices and methods of making such devices, and more particularly to a dynamic random access memory cell array and a process for manufacturing this array.

Dynamic RAM cells in which both the capacitor and the transistor are located within a trench in the face of a silicon bar are disclosed in my above-mentioned application, and by Richardson, et al, in Proceedings of the International Electronic Devices Meeting, IEEE, 1985, pp. 714–717; these structures greatly reduce the space occupied on the face of the bar, and so the density of cells can be very high. The Richardson, et al cell requires the use of a buried lateral contact to connect the source of the access transistor to the upper plate of the capacitor which forms the storage node, and the manufacturing steps for forming this contact are complex. Cells have been proposed such as that in U.S. Pat. No. 4,225,945 issued to Kuo and assigned to Texas Instruments, in which the capacitor and transistor are located within a trench, and in which the lower capacitor plate is the storage node, so the edge of the capacitor region forms the source of the access transistor and no buried contact is needed.

It is the principal object of this invention to provide an improved dynamic memory cell of the type having both the capacitor and the access transistor located within a trench to thereby reduce the space used on the surface. It is another object to provide a trench-type dynamic memory cell array which is more easily manufactured with existing process technology, particularly one that does not require a buried lateral contact. It is a further object to provide a cell with improved alpha particle immunity, and to provide a cell of smaller size, allowing a greater cell density.

SUMMARY OF THE INVENTION

In accordance with one embodiment of the invention a dynamic random access memory cell has a storage capacitor and an access transistor formed on only one sidewall of a trench etched into the face of a semiconductor bar. The storage capacitor uses the sidewall of the trench as the storage node, and uses a polysilicon plug as a common node. This polysilicon plug is part of a plate that extends along the face in the trench for a column of like cells, functioning to provide field-plate type of isolation between capacitors along the trench. The channel of the access transistor is formed in the upper part of the one sidewall of the trench, using an upper edge of the capacitor storage node as the source region of the transistor and having a buried N+drain region on the face at the top. The capacitor areas are isolated from one another on opposite sidewalls, so an array can be laid out that has two cells per bit, to provide improved alpha particle immunity, or by using two wordlines per row each capacitor can be addressed separately, providing higher density. Alternatively, only one word line per row can be used and the bit line can be split down the middle so that now one ridge or pillar supports two separate bit lines, again providing higher density.

BRIEF DESCRIPTION OF THE DRAWINGS

The novel features believed characteristic of the invention are set forth in the appended claims. The invention itself, however, as well as further objects and advantages thereof, will best be understood by reference to the following detailed description of particular embodiments, when read in conjunction with the accompanying drawings, wherein:

DETAILED DESCRIPTION OF SPECIFIC EMBODIMENTS

Figure 1:
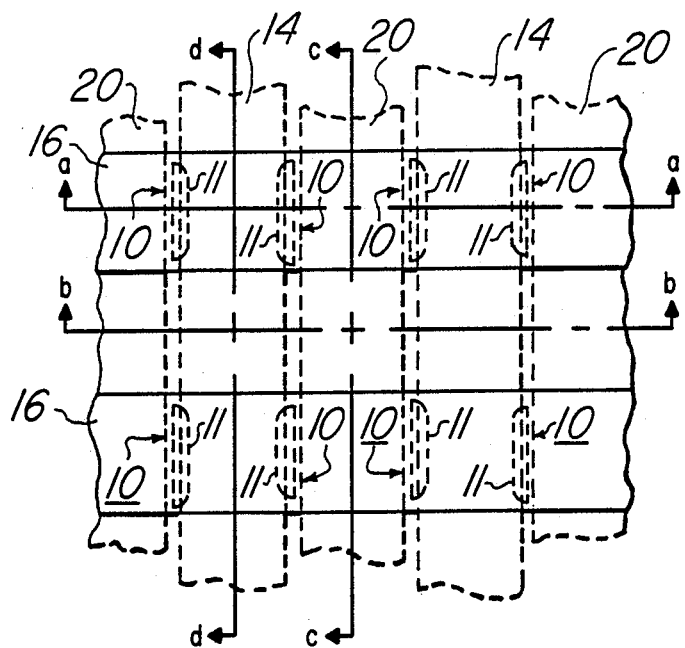
FIG. 1 is a plan view of a small part of a dynamic memory cell array constructed according to one embodiment of the invention.

FIGS. 1 and 2a–2d are plan and section views of an array of one-transistor dynamic random access memory cells, each cell having a transistor 10 and a capacitor 11 formed on a sidewall of a semiconductor region between trenches 12 in the face of a silicon bar 13. As is known in the art, the semiconductor region may be a free-standing pillar rather than a region between trenches. An N+ region 14 buried beneath a layer of silicon oxide 15 in the upper portion of the semiconductor region forms the bitline for a column of these cells and forms the drain of each of the access transistor 10. Wordlines are provided by elongated polysilicon strips 16, which extend down into the trenches 12 to create the gates 17 of the access transistors. The storage nodes of the capacitors 11 are formed by N-type regions 18 formed in the sidewalls of the lower portion of the semiconductor region between trenches 12, and an upper edge of this N-Type region also creates the source region 19 of each of the transistors 10. A polysilicon plug 20 fills the lower portion of each trench 12, and this plug is part of a strip-like field plate extending along this column to isolate capacitor areas 18 from one another; this field plate or plug 20 may be grounded as disclosed in my U.S. Pat. No. 4,345,364, or may have a voltage of about one-half Vdd applied to it for the reasons explained in U.S. Pat. No. 4,240,092. At the bottom of each trench 12 is a thermal oxide layer 21 with an underlying P+ channel-stop 22 functioning to isolate the capacitor 11 on one sidewall of the trench from the capacitor 11 on the other sidewall of this trench.

Figure 2A:
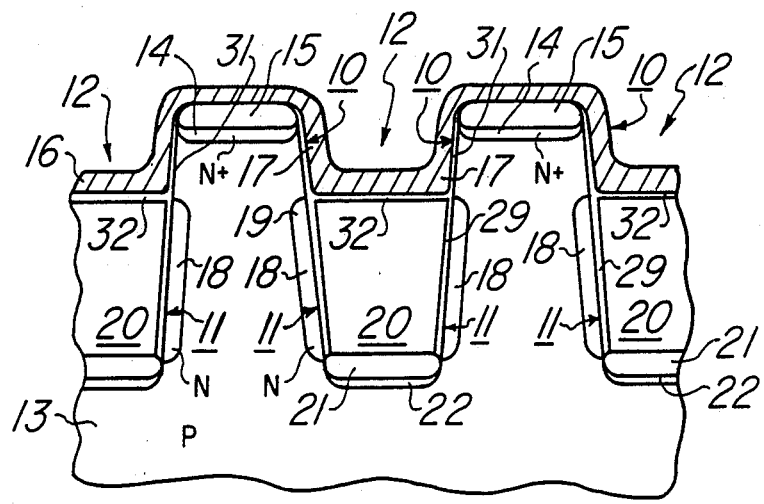
FIGS. 2a–2d are elevation views in section of the cell array of FIG. 1, taken along the lines a—a, b—b, c—c and d—d of FIG. 1.
Figure 2B:
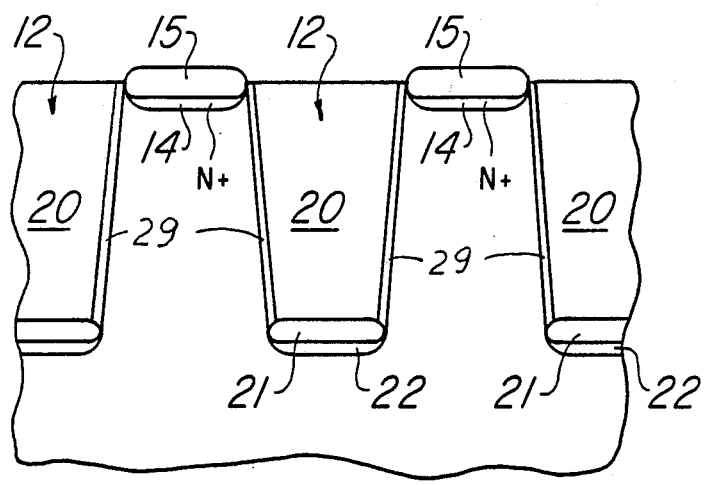
Figure 2C:
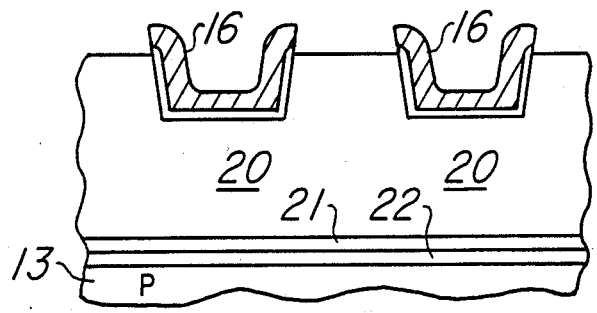
Figure 2D:
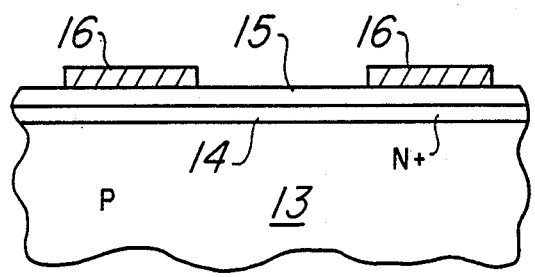
Figure 3:
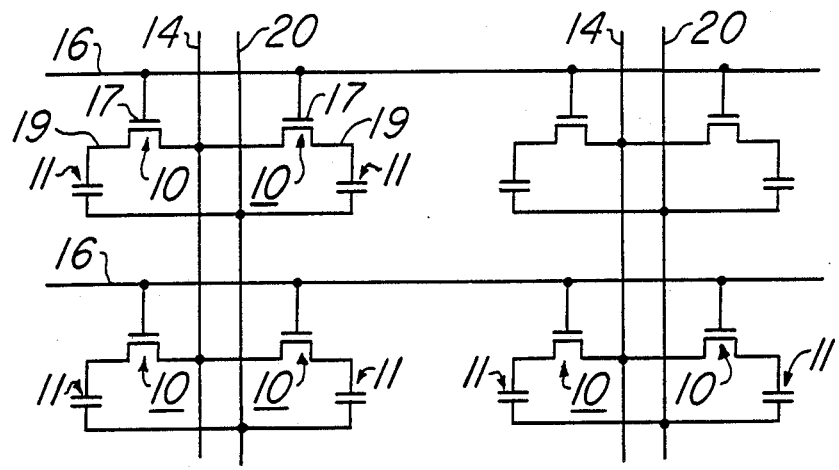
FIG. 3 is an electrical schematic diagram of the cells of FIGS. 1 and 2a–2d.

The cell array of FIGS. 1-3 has two storage capacitors 11 and two access transistors 10 for each cell; that is, when one wordline 16 is activated and one bitline 14 is sensed (selected by column decode), then two transistors 10 are turned on and two capacitors 11 are charge-shared with the bitline 14. Thus, if there has been a soft error introduced, as by an alpha particle partially discharging one of the capacitors 11, then a true bit of data can still be sensed. However, instead of employing two capacitors per cell, the concept of the invention can be used to provide a greater density of cells by using only one capacitor and one capacitor per cell, as will be described hereinafter.

Figure 4A:
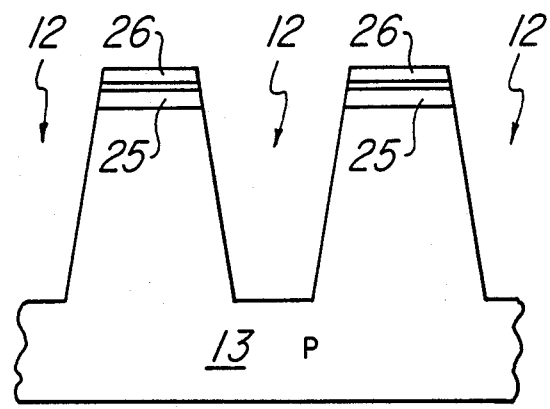
FIGS. 4a–4d are section views like FIG. 2a at various stages of manufacture of the cell of FIGS. 1–3.
Figure 4B:
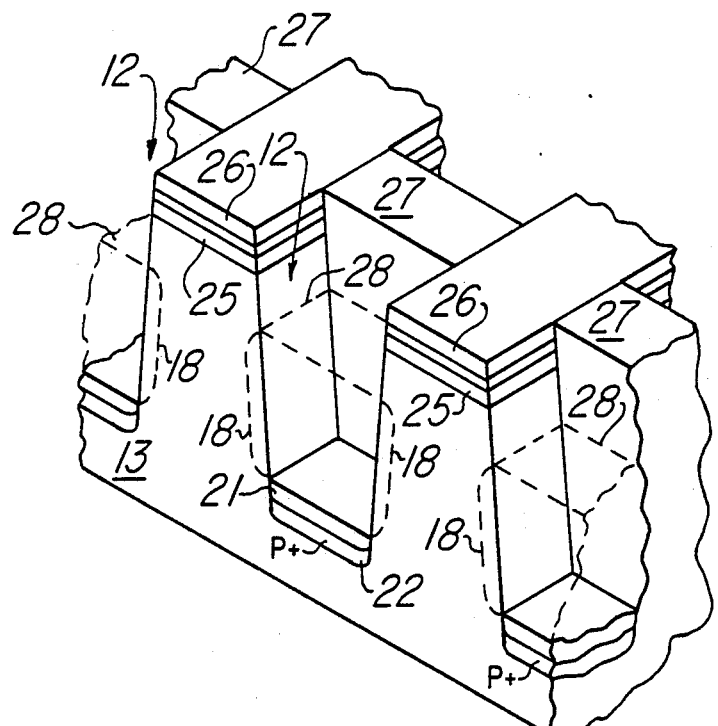
Figure 4C:
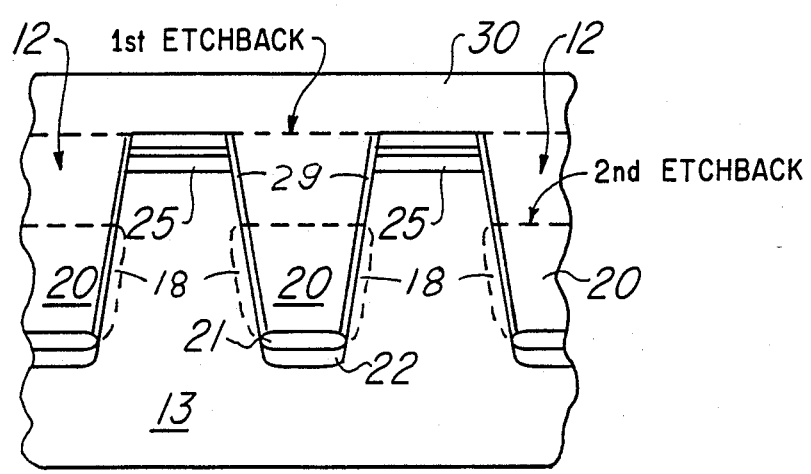
Figure 4D:
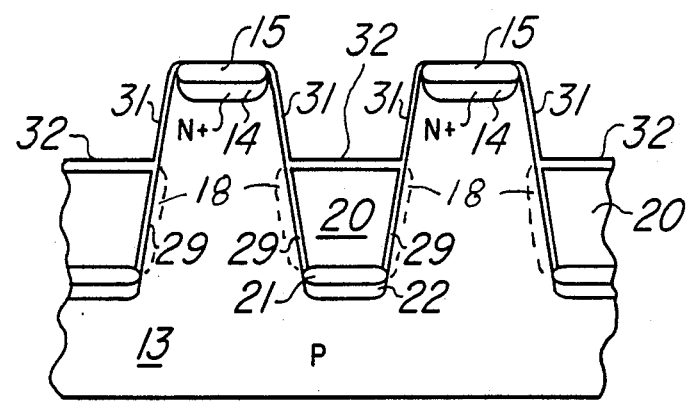

A method of making the cell array of FIGS. 1-3 will be described with reference to FIGS. 4a-4d. The starting material is a slice of P-type semiconductor-grade single-crystal silicon of which the bar 13 is only a very minute part; the cells of FIG. 1 and 2a-2d are of course only a few of 4-Meg or 16-Meg on a bar, and perhaps several hundred bars would be formed on a slice at one time. Only the steps used to create the cell array will be described, it being understood that the periphery of the device would be made using CMOS processing as is usual at the present time, or in addition bipolar devices may be included as well. First, a thin coating of silicon oxide is grown and an arsenic implant is performed, using a suitable mask such as photoresist if desired, to produce N+ implanted regions 25 which will become the bitlines 14. A layer of silicon nitride 26 is applied to the top face of the slice, and this nitride is patterned to leave exposed only the areas where the trenches 12 are to be etched. An anisotropic etch is performed to a depth of perhaps five to ten microns to create the trenched structure as seen in FIG. 4a. The width of each trench 12 at the face is about 2 microns or less. The next step is creation of the isolating channel stop 22 and its overlying thermal oxide 21, which is done by first applying another nitride coating and removing from the trench bottoms but not from the sidewalls by an anisotropic etch. A boron implant is performed to dope P+ the bottoms of the trenches, then a thermal oxidation produces the oxide layer 21 with the channel stop 22 beneath it as seen in FIG. 4b. The nitride coating is then removed from the sidewalls by etching, and the trenches are filled with a deposited silicon oxide which may be doped with P type impurity, and this deposited silicon oxide is etched in a pettern parallel to what will be wordlines 16 to leave oxide bridges 27 as seen in FIG. 4b to mask N+ doping. Next the N+ regions 18 are created in the sidewalls of the trenches by first coating the entire face, filling the trenches, with a deposited, N+ doped silicon oxide, then subjecting the face to a uniform reactive ion etch to remove all of this oxide except a plug 28 in the trench; an oxide cap might be added to prevent outdiffusion from doping the upper part of the sidewalls, and then the slice is subjected to a high temperature for a time sufficient to diffuse N-type impurity such as phosphorous or arsenic from the oxide plug 28 into the sidewalls of the trenches to form the N-type capacitor regions 18. An etch is now performed to remove the oxide bridges 27 and the oxide plugs 28. As seen in FIG. 4c, a thermal oxidation is performed to form the capacitor dielectric 29; this dielectric may be thermal silicon oxide at about 100 to 150A thickness, for example, or it may be a combination of thermal silicon oxide and an added coating of silicon nitride, creating an effective die-electric thickness of about 100A. Doped polysilicon 30 is not deposited to cover the entire face and to fill the trenches 12, then this polysilicon is etched back using a reactive ion etch to the level of the original nitride 26, then a masking operation is performed using photoresist to cover the areas between cells and to leave exposed the areas above that will be the transistors 10, so the anisotropic etch can be continued to leave the plugs 20; that is, the etching of the polysilicon 30 now is performed to stop when about the level of the tops of the regions 18 are reached so the shape seen in FIG. 2c is achieved. This etch of the polysilicon 30 is performed to expose the sidewalls where the channels of the transistors 10 are to be. The polysilicon 30 is left at the level of the original top surface in the spaces between cells, but is etched down to the level of the top of the N+ regions 18 in the areas beneath where the wordlines 16 are to be. Turning now to FIG. 4d, the next step is to remove the nitride 26 and subject the bar to an oxidation to grow the thermal oxide 15 and drive in the bitlines 14, as well as to grow transistor gate oxide 31 and a thicker oxide 32 over the polysilicon 20. This oxidation will grow thick oxide 15 preferentially on the heavily-doped silicon of the arsenic-implanted region 25 but thin oxide 31 on the relatively undoped transistor channel area; at the same time, an oxide coating 32 grows on the exposed polysilicon 20 in the trench 12 to serve to insulate the wordline 16 from the plug 20. Fabrication of the cell is completed by then depositing a polysilicon layer and patterning it to form the wordline 16 as seen in FIGS. 1 and 3; alternatively, instead of using a polysilicon wordline, a metal or silicided-polysilicon wordline may be employed.

Figure 5:
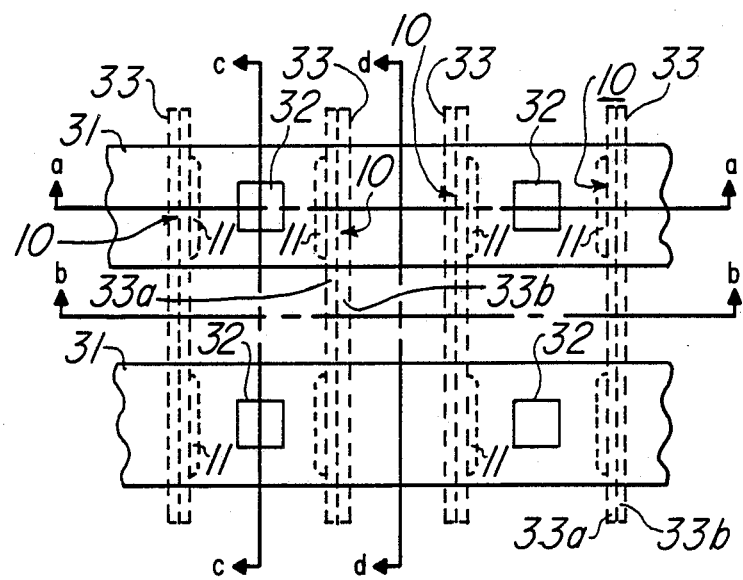
FIG. 5 is a plan view like FIG. 1, but for another embodiment of the invention.
Figure 6A:
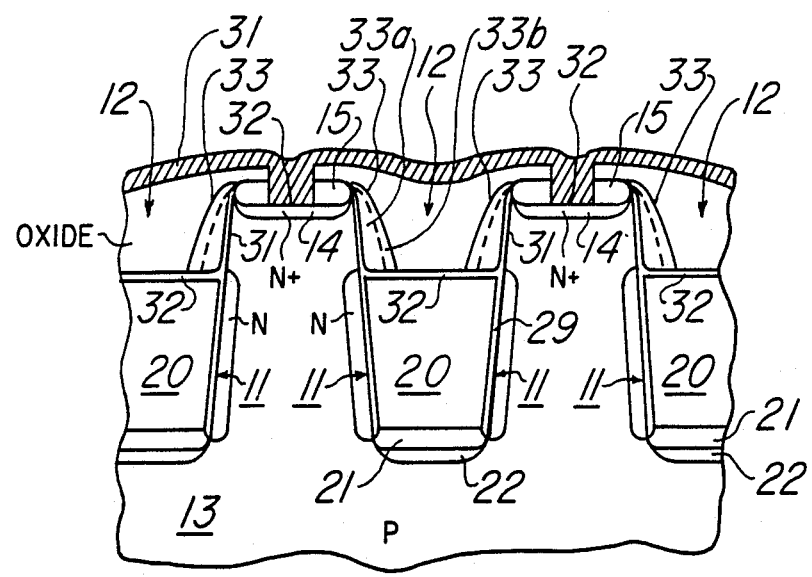
FIGS. 6a–6d are elevation views in section of the embodiment of FIG. 5.
Figure 6B:
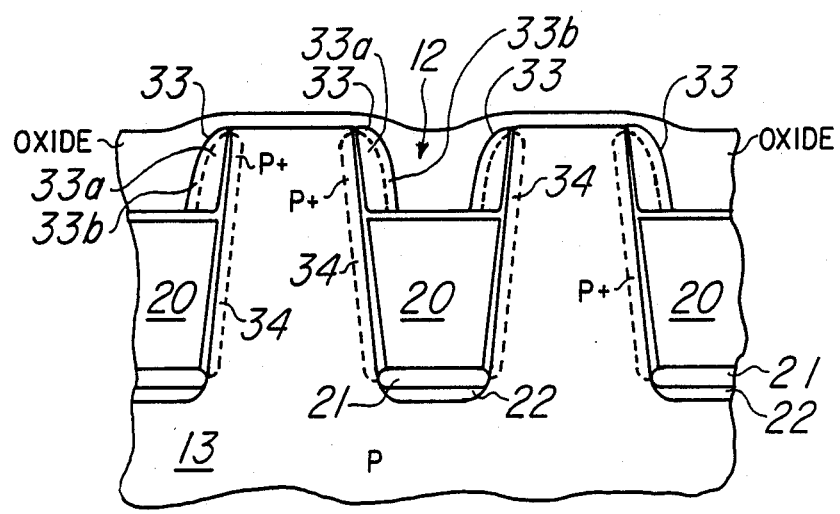
Figure 6C:
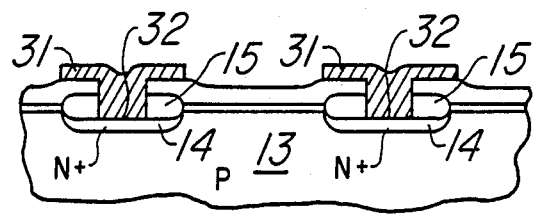
Figure 6D:
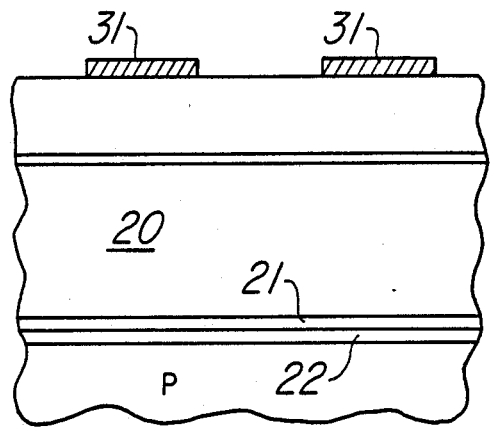
Figure 7:
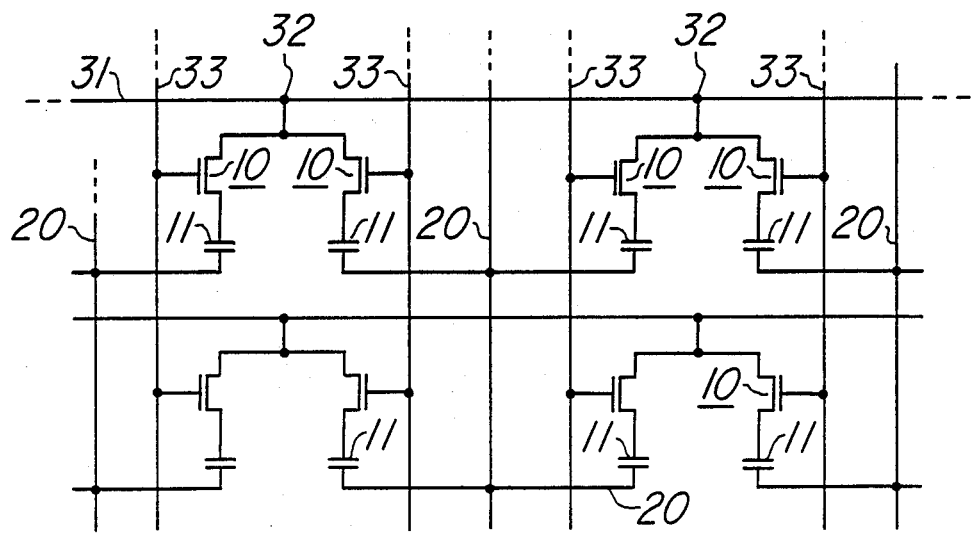
FIG. 7 is an electrical schematic diagram of the cell array of FIGS. 5 and 6a–6d.

Referring now to FIGS. 5, 6a-6d, and 7, another embodiment of the invention uses the same structure for the trenches 12, capacitor regions 18 and isolating channel stops 22, but has the bitlines and wordlines running differently. That is, bitlines 31 are metal lines extending along the top face, perpendicular to the trenches 12, and these bitlines make metal-to-silicon contacts 32 to the N+ drain regions 14 through oxide 15. The wordlines in this embodiment are filaments 33 on the sidewalls of the trenches, extending parallel to the trenches 12, actually in the trenches. In order to reduce the electrical resistance of these wordline filaments 33, they may be preferably composed of two layers 33a and 33b; the layer 33a is polycrystalline silicon to provide the desired transistor gate characteristic, while the layer 33b is silicide or metal to reduce the resistance. As seen in the section view of FIG. 6b, P+ regions 34 are diffused into the sidewalls of the trenches 12 to prevent parasitic transistor action due to the wordlines 33, in the areas between cells. The transistor drain regions 14 are broken into individual areas instead of extending along an entire column to form a bitline, since here the bitlines extend at right angles to, instead of parallel to the trenches 12. In the embodiment of FIGS. 5-7, there is only one transistor and one capacitor for each cell, rather than two of each as was the case for the embodiment of FIGS. 1-3. Thus, the cell density is higher for the FIG. 5-7 embodiment, but the advantages of greater alpha particle immunity is not achieved. The process for making the cell array of FIGS. 5-7 is quite similar to that of FIGS. 4a-4d, but the wordlines 33 are made by the technique of deposition followed by anisotropic etch which leaves the sidewalls coated but removes material on flat surfaces.

Figure 8:
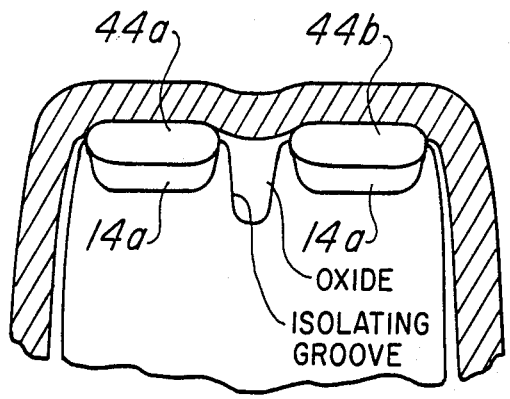
FIG. 8 is an elevation view in section of a small part of the cell array of FIGS. 1–3 according to another embodiment of the invention.
Figure 9A:
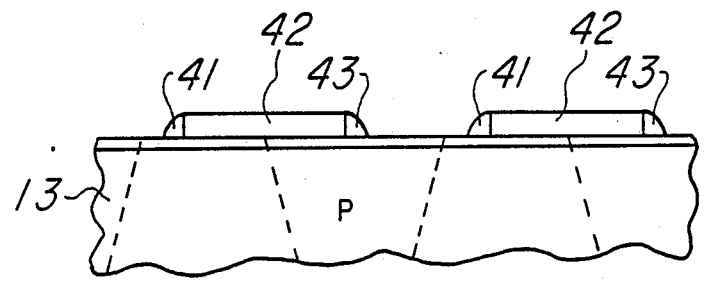
FIGS. 9a and 9b are views like FIG. 8 in various stages of manufacture.
Figure 9B:
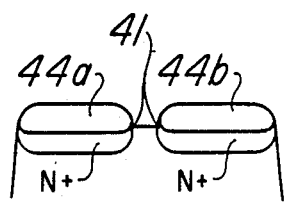

In still another embodiment of the invention, illustrated in FIG. 8, the construction is exactly like FIGS. 1-3 with one major exception; the bitlines 14 are each split into two bitlines 14a and 14b, so that there is only one transistor 10 and one capacitor 11 for each cell. The process for forming the split bitlines is illustrated in FIGS. 9a–9b. Sidewall filaments 41 are created above where the split is to be formed in what is to be the bitlines, then the dummy material 42 and the other (unused) sidewalls 43, are removed by a masked etch. The filaments 41, along with a photoresist operation, are then used to mask an arsenic implant then a silicide operation, to leave a structure as seen in FIG. 9b including N+ regions 14a and 14b and overlying silicided regions 44a and 44b. The filaments 41 are then removed by etching, using the silicide 44a and 44b as an etch stop to allow etching out a small trench 45 between the bitlines for isolation.

In another embodiment, the cells can be formed on pillars rather than on ridges between trenches; this would be accomplished by etching another set of trenches perpendicular to the trenches 12, generally in the position of the bridges 27 of FIG. 4b, after filling with deposited oxide, providing more isolation between cells.

While this invention has been described with reference to illustrative embodiments, this description is not meant to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A dynamic random-access memory cell of the type having at least one storage capacitor and at least one access transistor formed at a face of a semiconductor body, comprising:
   a pair of parallel trenches extending into said face of the semiconductor body on opposite sides of a semiconductor region formed by said parallel trenches,
   a heavily-doped transistor drain region formed in the upper portion of said semiconductor region between said parallel trenches,
   a conductive material filling a lower portion of said trenches and insulated by a capacitor dielectric from the sidewalls of said semiconductor region between said parallel trenches,
   a pair of separate capacitor regions each formed in a lower portion of each sidewall of said semiconductor region between said parallel trenches, the capacitor regions doped with impurity different from the doping of said body, each said capacitor region being spaced from said drain region by a channel area in said sidewall, and each capacitor region being electrically isolated along said face from other capacitor regions of other cells, and
   a gate separated from each said channel area by a transistor gate oxide,
   wherein said storage capacitor is formed by said conductive material, said capacitor dielectric and at least one of said capacitor regions formed in said sidewall.

2. A device according to claim 1 wherein said body is silicon and said conductive material is polycrystalline silicon.

3. A device according to claim 1 wherein said body is predominately P-type silicon, said heavily-doped region is $N_+$-type silicon, and said capacitor region is N-type silicon.

4. A device according to claim 1 wherein a field oxide and channel stop in the bottom of each of said trenches serves to isolate said capacitor regions of said cell from capacitor regions of adjacent cells.

5. A device according to claim 1 wherein said cell has two access transistors connected to said drain region and a storage capacitor connected to each said access transistor.

6. A device according to claim 5 wherein said gates of said two access transistors for said cell are part of a wordline extending along said face, said wordline also forming gates of all transistors in a row of such cells.

7. A device according to claim 6 wherein said conductive material in each trench is part of a strip-like field plate extending along a column of cells to isolate capacitor regions of adjacent cells from one another.

8. A device according to claim 1 wherein said semiconductor region is a free-standing pillar.

9. A device according to claim 1 wherein each of said at least one access transistor has said gate formed at a sidewall of said semiconductor region.

* * * * *